United States Patent
Chambers et al.

(10) Patent No.: US 8,389,391 B2
(45) Date of Patent: Mar. 5, 2013

(54) TRIPLE-GATE TRANSISTOR WITH REVERSE SHALLOW TRENCH ISOLATION

(75) Inventors: James J. Chambers, Dallas, TX (US); Mark R. Visokay, Wappingers Falls, NY (US)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 12/696,616

(22) Filed: Jan. 29, 2010

(65) Prior Publication Data

US 2010/0323486 A1 Dec. 23, 2010

Related U.S. Application Data

(63) Continuation of application No. 11/739,567, filed on Apr. 24, 2007, now Pat. No. 7,678,675.

(51) Int. Cl.
*H01L 21/3205* (2006.01)
(52) U.S. Cl. ......... 438/585; 438/584; 438/429; 438/430
(58) Field of Classification Search .................. 438/296, 438/218, 584, 585, 429, 430
See application file for complete search history.

(56) References Cited

U.S. PATENT DOCUMENTS

| | | | |
|---|---|---|---|
| 4,552,595 A | 11/1985 | Hoga | |
| 6,653,192 B1 * | 11/2003 | Ryoo | 438/275 |
| 6,746,923 B2 | 6/2004 | Skotnicki et al. | |
| 6,835,618 B1 * | 12/2004 | Dakshina-Murthy et al. | 438/256 |
| 2003/0148619 A1 * | 8/2003 | Tsai et al. | 438/704 |
| 2003/0194871 A1 | 10/2003 | Hsu | |
| 2003/0219683 A1 | 11/2003 | Nagarajan et al. | |
| 2004/0217433 A1 | 11/2004 | Yeo et al. | |
| 2007/0166891 A1 * | 7/2007 | Park | 438/149 |
| 2008/0150037 A1 | 6/2008 | Teo et al. | |

* cited by examiner

*Primary Examiner* — N Drew Richards
*Assistant Examiner* — Yu-Hsi Sun
(74) *Attorney, Agent, or Firm* — Alan A. R. Cooper; Wade J. Brady, III; Frederick J. Telecky, Jr.

(57) ABSTRACT

Example embodiments provide triple-gate semiconductor devices isolated by reverse shallow trench isolation (STI) structures and methods for their manufacture. In an example process, stacked layers including a form layer over a dielectric layer can be formed over a semiconductor substrate. One or more trenches can be formed by etching through the stacked layers. The one or more trenches can be filled by an active area material to form one or more active areas, which can be isolated by remaining portions of the dielectric layer. Bodies of the active area material can be exposed by removing the form layer. One or more triple-gate devices can then be formed on the exposed active area material. The example triple-gate semiconductor devices can control the dimensions for the active areas and provide less isolation spacing between the active areas, which optimizes manufacturing efficiency and device integration quality.

17 Claims, 6 Drawing Sheets

US 8,389,391 B2

TRIPLE-GATE TRANSISTOR WITH REVERSE SHALLOW TRENCH ISOLATION

This is a continuation of U.S. application Ser. No. 11/739,567, filed Apr. 24, 2007, the entirety of which is incorporated herein by reference.

BACKGROUND

This invention relates generally to semiconductor devices, and, more particularly, to triple-gate transistors and methods for their manufacture.

Multi-gate transistors have been developed for next-generation devices. Example multi-gate transistor designs include dual-gate and triple-gate transistors, as well as quad-gate transistors and "PI"-gate transistors. These devices overcome performance and process limitations of conventional planar transistor devices due to a reduction in gate length accompanied with scale down.

For example, the length of the gate structure is typically the smallest dimension of conventional planar MOS transistors in order to increase device density, improve performance (e.g., increase switching speed), and to reduce power consumption. However, current photolithographic and etching techniques generally limit the extent to which transistor dimensions can be reliably scaled. In addition, as the gate length is reduced, the transistor performance can be inhibited by short channel effects, which can lead to an increased drain induced barrier lowering (DIBL) and/or an increased off-state current due to the threshold voltage (Vt) roll-off.

Multi-gate transistors provide more control over a scaled channel by situating the gate around two or more sides of the channel silicon, wherein a shorter channel length can be achieved for the same gate dielectric thickness or similar channel lengths can be used with thicker gate dielectrics.

Typically, a silicon-on-insulator (SOI) wafer is provided for conventional multi-gate transistors. The SOI wafer includes a substrate with an overlying oxide insulator and a 20.0-50.0 nm thick semiconductor layer above the oxide. The upper silicon layer is etched away, leaving isolated islands or blocks of silicon, and a gate is formed around the silicon blocks, with the ends of the blocks being doped to form source/drains. Because the gate extends on more than one peripheral side of the channel, multi-gate designs can alleviate the short channel effects seen in scaled planar transistors. In practice, however, the conventional multi-gate approaches have suffered from cost and performance shortcomings, because SOI wafers are more expensive than ordinary silicon substrates and because the channel surface has been etched while carving the upper SOI silicon layer into islands or blocks.

In addition, conventional multi-gate transistors include shallow trench isolation (STI) structures formed in the neighborhood of the device. Conventional STI structures typically generate a compressive stress in the channel region of the transistor. This reduces the carrier mobility and degrades the device performance. A conventional solution to reduce the detrimental effect of the STI structures is to recess the STI structures on bulk, i.e., the STI structures are thinned below the surface of the substrate. Problems arise, however, since recessing the STI structures exposes the silicon substrate at the sidewall of the substrate. As a result of the insufficient gate wrap, device performance degrades, especially as the devices are scaled down.

Thus, there is a need to address these and other problems of the prior art and to provide an improved multi-gate transistor device and manufacturing techniques to avoid shortcomings of conventional planar or multi-gate transistors and provide devices built on silicon substrates with improved isolation and improved spacing for denser devices.

SUMMARY

According to various embodiments described, the present teachings include a method for making triple-gate devices. In this method, a form layer can be formed over a dielectric layer that is formed over a semiconductor substrate. One or more trenches can then be formed by etching through both the form layer and the dielectric layer with portions of a surface of the semiconductor substrate exposed. An active area material can then be deposited in the one or more trenches and bodies of the active area material can be exposed by removing the form layer. On the exposed bodies of the active area material, one or more triple-gate devices can finally be formed.

According to various embodiments, the present teachings also include another method for making triple-gate devices. In this method, a dielectric layer, having a thickness of about 30 nm to about 400 nm, can be formed on a semiconductor substrate. Through the dielectric layer, one or more trenches can be formed exposing portions of a surface of the semiconductor substrate. An active area material can then be deposited in the one or more trenches forming one or more active areas that are isolated by remaining portions of the dielectric layer. Bodies of the one or more active areas can then be exposed and one or more triple-gate devices can be formed thereon.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are illustrative and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to illustrate example embodiments utilizing the principles of the invention.

DESCRIPTION OF THE EMBODIMENTS

Example embodiments of principles of the invention are described below and illustrated in the accompanying drawings.

The example embodiments provide active semiconductor devices isolated by reverse shallow trench isolation (STI) structures and methods for their manufacture. The active devices can include, for example, transistors such as triple-gate transistors, memory cells, and the like.

As used herein, the term "reverse STI" refers to an isolation technique performed by first forming one or more trenches through dielectric layer(s) formed on a semiconductor substrate, and then filling the one or more trenches with semiconductor material(s) to create active areas for electrical active devices. The active areas can be isolated by the remaining portions of the dielectric layer(s), which can form isolation structures. In this manner, the isolation structures can be fabricated in a reverse order as compared with the formation of conventional STI structures while also providing more vertical sidewalls. Moreover, the dimensions of the trenches for the active areas can be determined by lithography and the mechanical stability of the dielectric material, which can provide less isolation spacing between active areas of semiconductor devices. Manufacturing efficiency and device integration quality can then be optimized.

In the following description, the semiconductor materials filled in the trenches to form active areas are also referred to as "active area materials". The active area materials can be deposited or grown in the one or more trenches by, for example, epitaxial (epi) techniques. In an epitaxial growth or deposition, a semiconductor crystalline material can be used to initiate the growth of the active area material. Active area materials can include, but are not limited to, silicon (Si), germanium (Ge), silicon germanium (SiGe), gallium (Ga), gallium arsenide (GaAs), indium phosphide (InP), gallium nitride (GaN), and gallium aluminum arsenide (GaAlAs). In various embodiments, the active area can be formed by selective epitaxial growth methods or non-selective epi growth methods known to one of ordinary skill in the art.

Figure 1:
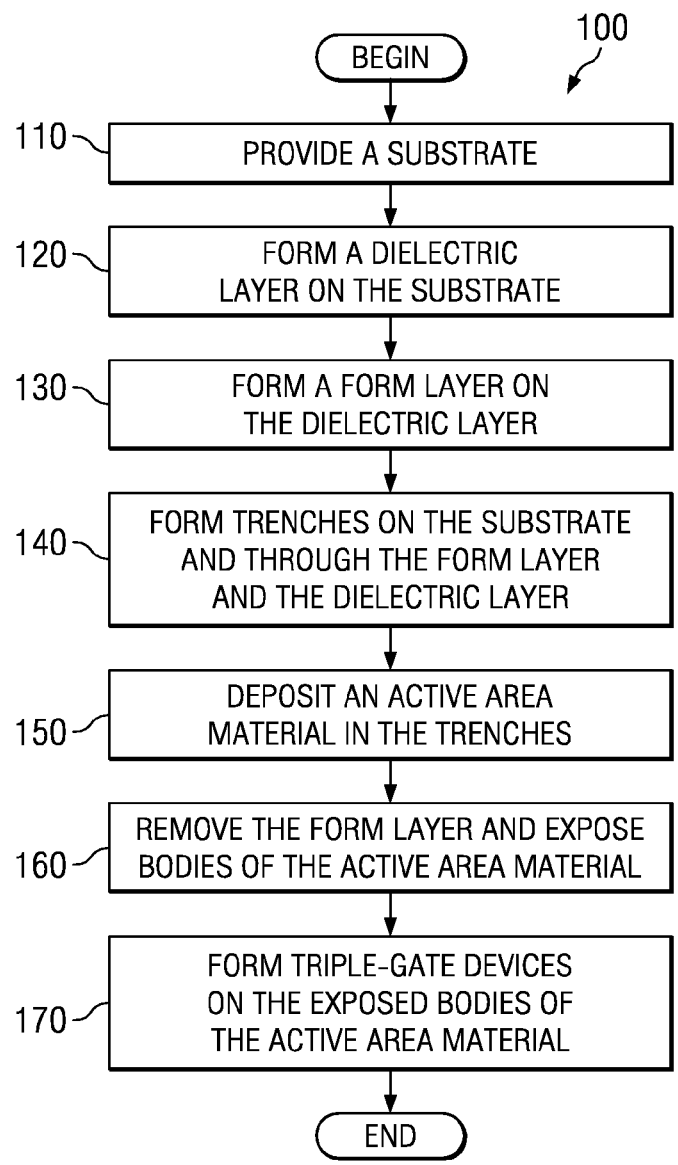
FIG. 1 depicts an example method for fabricating an example triple-gate semiconductor device using reverse shallow trench isolation (STI) techniques in accordance with the present teachings.

FIG. 1 depicts an example method 100 for fabricating an example triple-gate semiconductor device using reverse STI techniques in accordance with the present teachings. As shown at 110, the method 100 includes providing a semiconductor substrate, which can be, for example, a silicon substrate. In various embodiments, the semiconductor substrate can be formed of the same material as the active area materials.

At 120, a dielectric layer is formed on the semiconductor substrate. The dielectric layer may be formed of various dielectric materials, such as, for example, silicon oxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), tantalum oxide ($TaO_2$) or other insulating material(s).

Various methods can be used to fabricate the dielectric layer. For example, the dielectric layer can be formed by semiconductor growth techniques on the semiconductor substrate. In various embodiments, the dielectric layer can be a thermal silicon oxide ($SiO_2$) layer, which can be thermally grown on a silicon substrate in an $O_2$ or $H_2O$ ambient. In various embodiments, the dielectric layer can be formed by depositing dielectric materials on the semiconductor substrate. For example, the dielectric layer can be a silicon nitride ($Si_3N_4$) layer deposited by low pressure chemical vapor deposition (LPCVD) or a silicon oxide ($SiO_2$) layer deposited by high-density plasma chemical vapor deposition (HDPCVD) on the semiconductor substrate. These CVD deposition techniques are known to those of ordinary skill in the art.

In various embodiments, the dielectric layer can be engineered by using materials with various dielectric constants for a specific application. Example low-k dielectric materials can include, but are not limited to, fluorinated silicon dioxide (SiOF) and silicon oxycarbide (SiOC), while example high-k dielectric materials can include, but are not limited to, SiON, $Si_3N_4$, $HfO_2$, HfSiO, HfSiON, $Al_2O_3$, $ZrO_2$, barium strontium titanate (BST), lead zirconate titanate (PZT), $ZrSiO_2$, $TaO_2$, and the like. Standard fabrication techniques can be used to fabricate these materials. For example, a silicon oxynitride (SiON) layer can be deposited on the semiconductor substrate by a CVD process.

At 130, a form layer is formed over the dielectric layer. In various embodiments, the form layer can be used as a hard mask for the subsequent formation of trenches. The form layer can also be used as a placeholder for the formation of, for example, triple-gate structures. The form layer can be formed of materials including, but not limited to, silicon nitride ($Si_3N_4$), silicon oxynitride (SiON), silicon oxide ($SiO_2$) and silicon carbide (SiC). For example, the form layer can be formed of silicon nitride, which can be deposited by CVD techniques such as LPCVD or PECVD known to one of ordinary skill in the art.

At 140, one or more trenches with vertical sidewalls are formed through the stacked layers of the form layer and the dielectric layer, exposing portions of the surface of the semiconductor substrate.

In various embodiments, the one or more trenches can be formed by first patterning and etching the form layer and forming a patterned form layer. The dielectric layer can then be etched using the patterned form layer as a hard mask. The etch process of the dielectric layer can stop at the semiconductor substrate while leaving the remaining portions of the dielectric layer as isolation structures. The one or more trenches can be formed on the semiconductor substrate and isolated by the isolation structures.

During the formation of the one or more trenches, various suitable etch processes and/or chemistries known to one of ordinary skill in the art can be employed. For example, a nitride ($Si_3N_4$) form layer can be patterned by a standard photolithographic process and etched by a wet etch process such as a phosphoric acid wet etch or a dry etch process such as a plasma etch. The dielectric layer can, for example, be a thermally grown $SiO_2$ layer, which can be etched by a wet etch process such as a buffered oxide etch (BOE) or a dry etch process such as a plasma etch, using the patterned form layer as a hard mask.

In various embodiments, in order to reduce damage to the exposed portions of the semiconductor substrate surface (i.e., the bottom of the one or more trenches) during the formation of the one or more trenches, various etch processes can be combined. For example, a dry etch of the dielectric layer can be a partial dry etch, which can be followed by a wet strip (i.e., a wet etch) to expose the surface of the semiconductor substrate and form the one or more trenches.

In various embodiments, the geometry of the one or more trenches for active areas can be determined by the lithographic process and the mechanical stability of the dielectric materials used. In this case, the geometry of the isolation structures (determined by the geometry of the one or more trenches) will not be limited by the ability to fill an isolation trench, as is the case with conventional STI structures. In various embodiments, the area of the isolation structures can be further reduced by increasing a width of the one or more trenches for active devices, for example, by trimming the patterned form layer after its formation but before the etch process of the dielectric layer. Therefore, the method 100 can provide improved spacing for denser semiconductor devices.

In various embodiments, a pretreatment can be conducted on the one or more trenches prior to the subsequent epitaxial process in order to remove any damage on the exposed surface of the semiconductor substrate (i.e., the bottom of the one or more trenches). For example, a pretreatment including an annealing process can be performed in a gas environment of nitrogen ($N_2$) or hydrogen ($H_2$) with a temperature higher than 1000° C. after the formation of the one or more trenches but before the subsequent epitaxial process.

In various embodiments, stressor layers can be formed as vertical sidewalls along the one or more trenches. The stressor layer sidewalls can be used to enhance carrier (i.e., electron and/or hole) mobility and thus to enhance the performance of the active devices such as MOS transistors. In various embodiments, the stressor layers can also be referred to as a spacer layer or a buffer layer on the sidewall of the one or more trenches. Various materials can be used for the stressor layer including, for example, $Si_3N_4$, SiON, or $SiO_2$.

At 150, one or more active areas are formed by filling the one or more trenches with the active area material using the epitaxial growth from the exposed surface of the semiconductor substrate. In various embodiments, the one or more active areas can be filled with the same material as the semiconductor substrate, for example, silicon. The one or more active areas can be isolated by the stacked layers of the patterned form layer and the isolation structures. Optionally, a planarization process such as a chemical-mechanical polishing (CMP) can be conducted to remove post-epitaxial growth from the surface of the one or more active areas.

At 160, bodies of the active area materials are exposed (also referred to herein as "elevated") by removing the patterned form layer, while leaving a lower surface, that is, the surface of the isolation structures. For example, the patterned form layer can be a patterned silicon nitride layer, which can be removed using hot phosphoric acid ($H_3PO_4$) at a temperature of, for example, about 140-180° C. The hot phosphoric acid can provide selective etching of the silicon nitride without attacking the dielectric isolation structures.

In various embodiments, the bodies of the active area materials can be exposed or elevated by an etch back process when the stacked layers are formed of the same material, for example, $SiO_2$. In this case, the stacked layers including the form layer and the dielectric layer can be replaced by a thick dielectric layer with a thickness of about 30 nm to about 400 nm.

At 170, example triple-gate devices are formed over the exposed semiconductor bodies and isolated by the isolation structures using standard process flows for triple-gate transistors. For example, a gate dielectric can be formed over portions of the surface of the exposed semiconductor bodies and isolation structures, and over the side and upper surfaces of the exposed semiconductor bodies. The gate dielectric can be, for example, any thin dielectric material such as that used for the dielectric layer, for example, $SiO_2$, SiON, or other dielectric material, via an oxidation growth or a deposition process. A gate electrode, such as polysilicon, metal, or other suitable material, can then be formed above the formed gate dielectric, wherein the gate dielectric and electrode can be formed with any suitable thickness. In addition, suitable dopants can be introduced into source/drain portions of the exposed or "elevated" semiconductor bodies using an implantation or diffusion process known to one of ordinary skill of the art. Sidewall spacers can also be formed along the sidewalls of the encapsulated gate structure and the sidewalls of the exposed semiconductor bodies.

FIGS. 2A-2F depict cross-sectional views of an example triple-gate semiconductor device 200 at various stages of fabrication in accordance with the present teachings. Those of ordinary skill in the art will appreciate that the depiction of the semiconductor device in FIGS. 2A-2F is a generalized schematic illustration, and that other areas/layers may be added or existing areas/layers may be removed or modified.

Figure 2A:
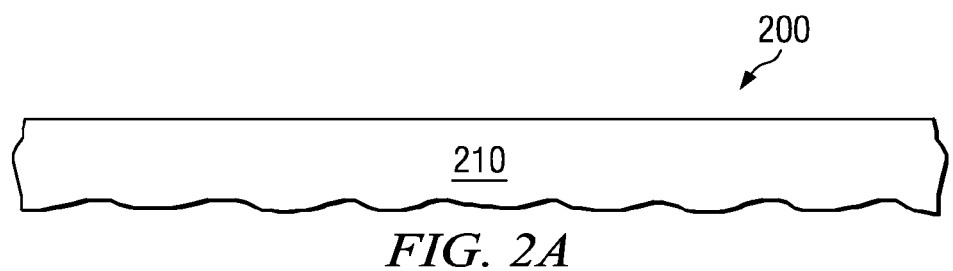
FIGS. 2A-2F depict cross-sectional views of an example triple-gate semiconductor device at various stages of fabrication in accordance with the present teachings.
Figure 2B:
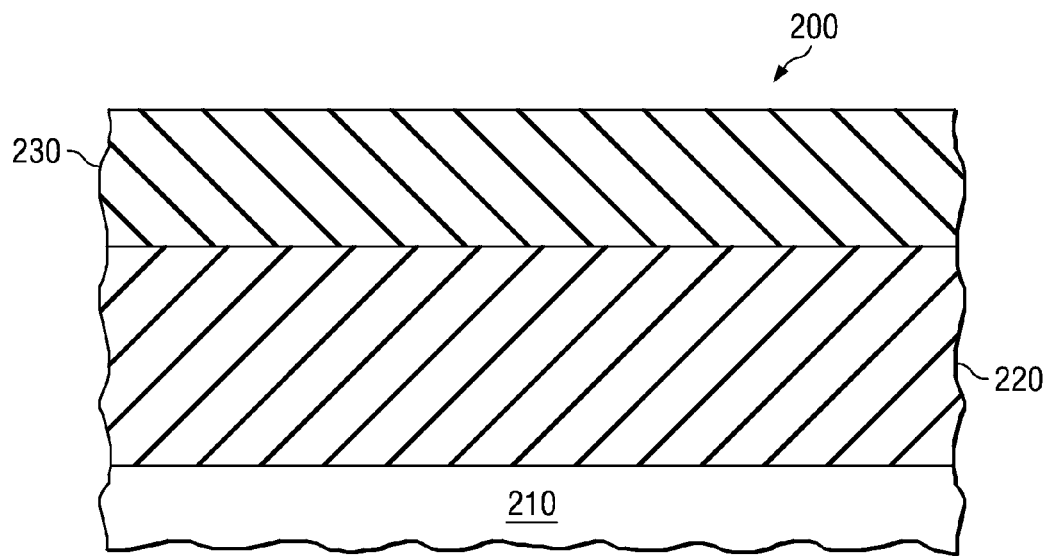
Figure 2C:
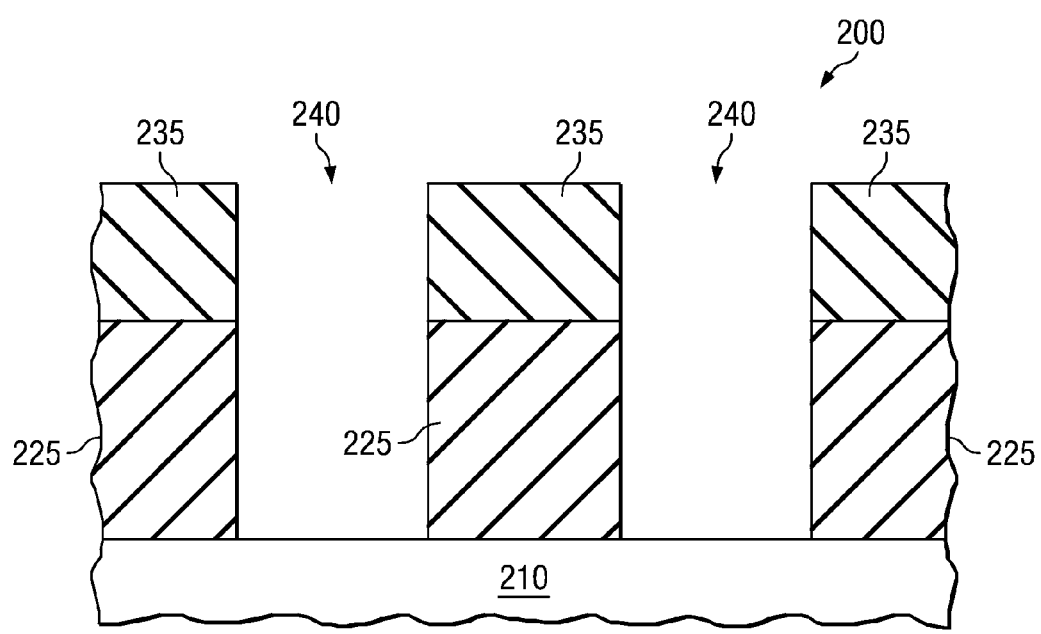
Figure 2D:
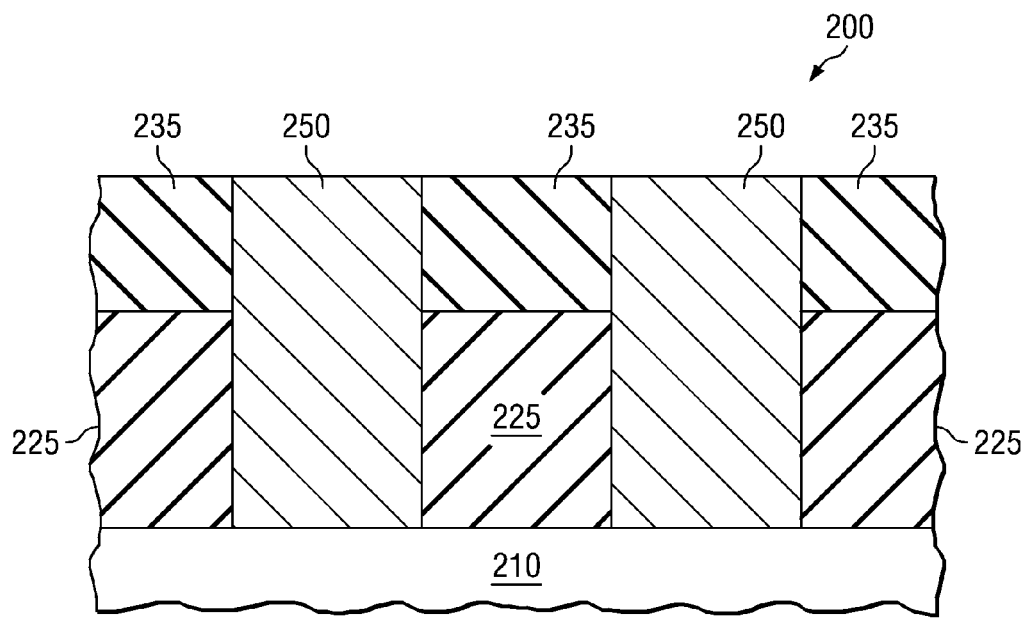
Figure 2E:
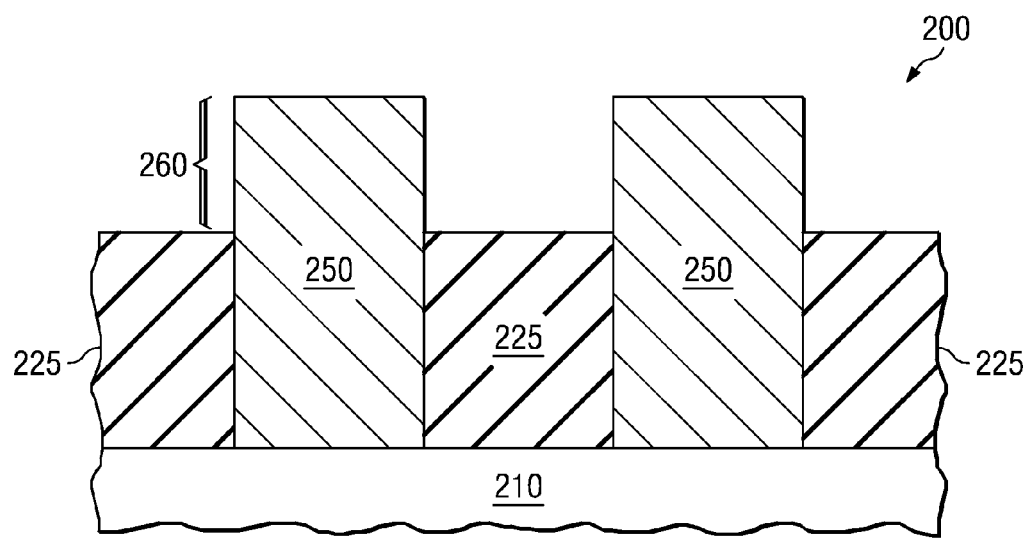
Figure 2F:
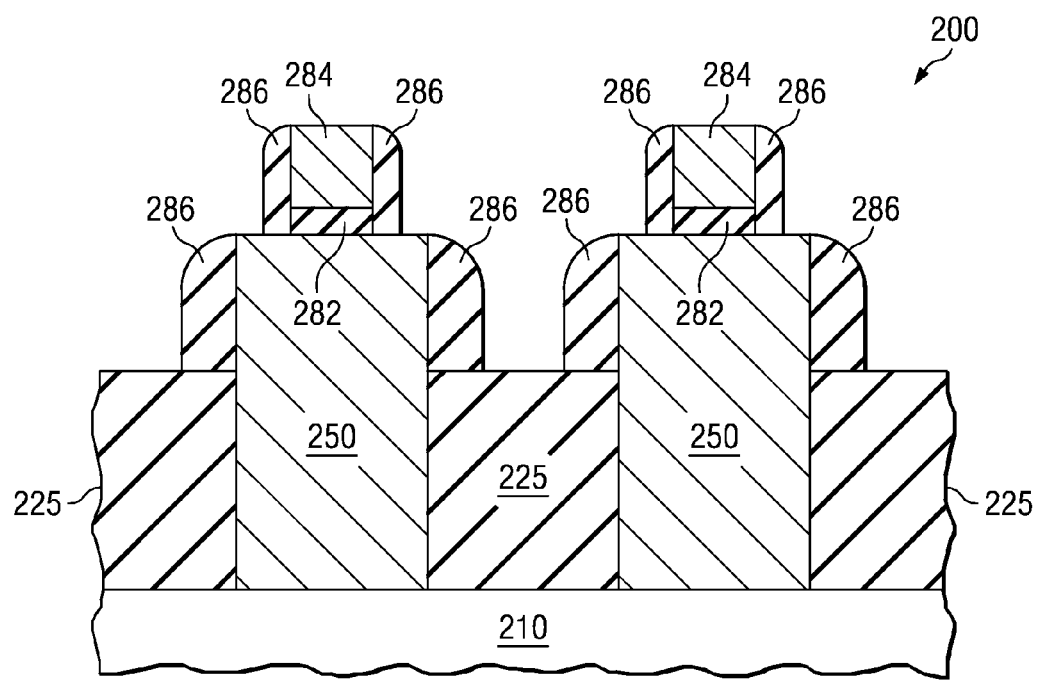

The example semiconductor device 200 can be processed generally according to the method 100 as described herein. In FIGS. 2A-2B, stacked layers including a form layer 230 formed over a dielectric layer 220 can be formed over a semiconductor substrate 210. In FIG. 2C, one or more trenches 240 can be formed through the stacked layers by patterning and etching the stacked layers and leaving a patterned form layer 235 over the remaining portions of the dielectric layer, which can form isolation structures 225. Portions of the surface of the substrate 210 can be exposed. In FIG. 2D, one or more active areas 250 can be formed by filling the one or more trenches 240 with active area materials grown or deposited from the surface of the semiconductor substrate 210. In FIG. 2E, bodies 260 of the active area materials can be exposed by removing the patterned form layer 235 and keeping the isolation structures 225. In FIG. 2F, example triple-gate devices can be formed over the semiconductor device 200 shown in FIG. 2E and isolated by the isolation structures 225.

Figure 2G:
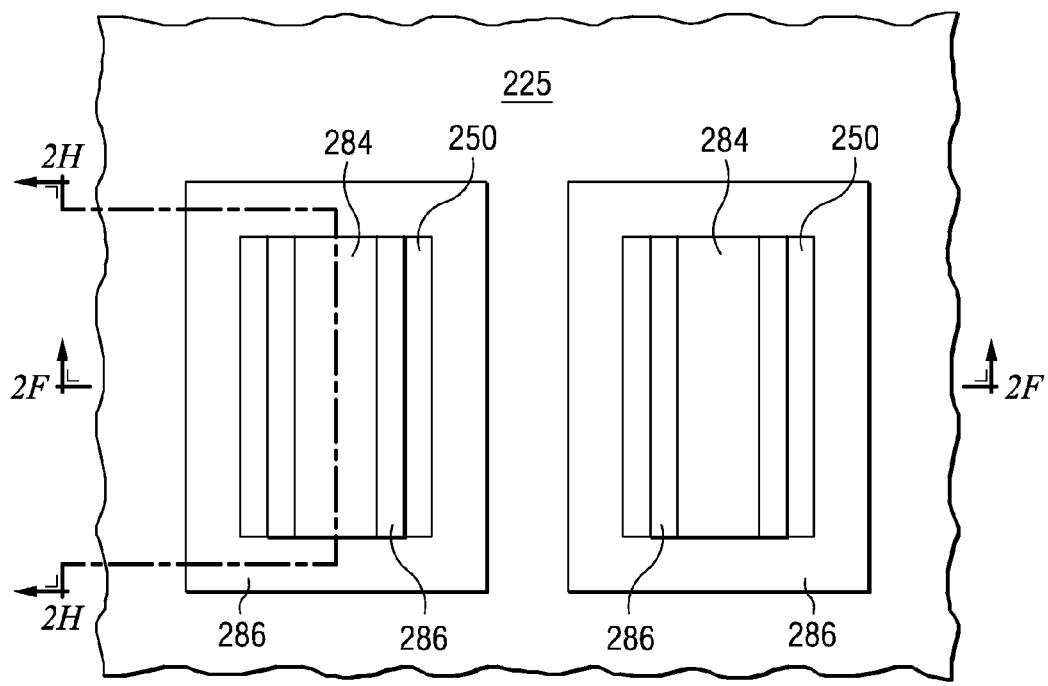
FIGS. 2G-2H depict a top plan view and a side view, respectively, for the semiconductor device with a front view shown in FIG. 2F in accordance with the present teachings.
Figure 2H:
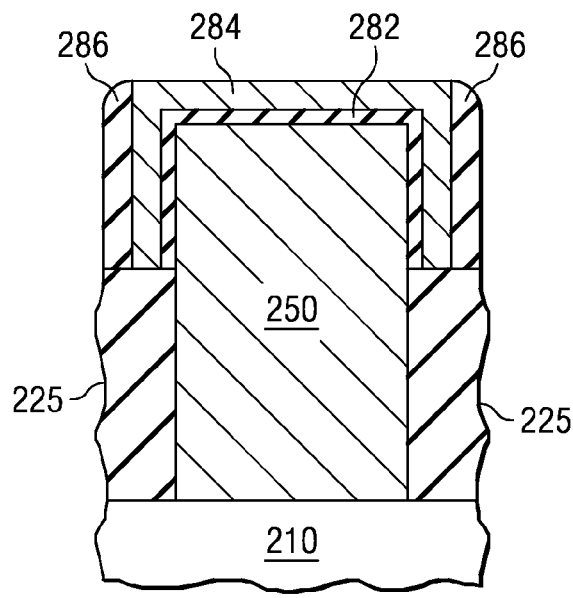

While FIG. 2F depicts a front view of the example semiconductor device 200, FIGS. 2G-2H depict a top plan view and a side view, respectively, for the semiconductor device 200 shown in FIG. 2F.

As shown in FIGS. 2F-2H, the semiconductor device 200 can include example triple-gate devices formed by standard process flows known to one of ordinary skill in the art. The example triple-gate devices can include a gate electrode 284 formed over a gate dielectric 282, and sidewall spacers 286 formed along the sidewalls of the encapsulated gate structure and the sidewalls of the semiconductor bodies 260 (see FIG. 2E).

Figure 3A:
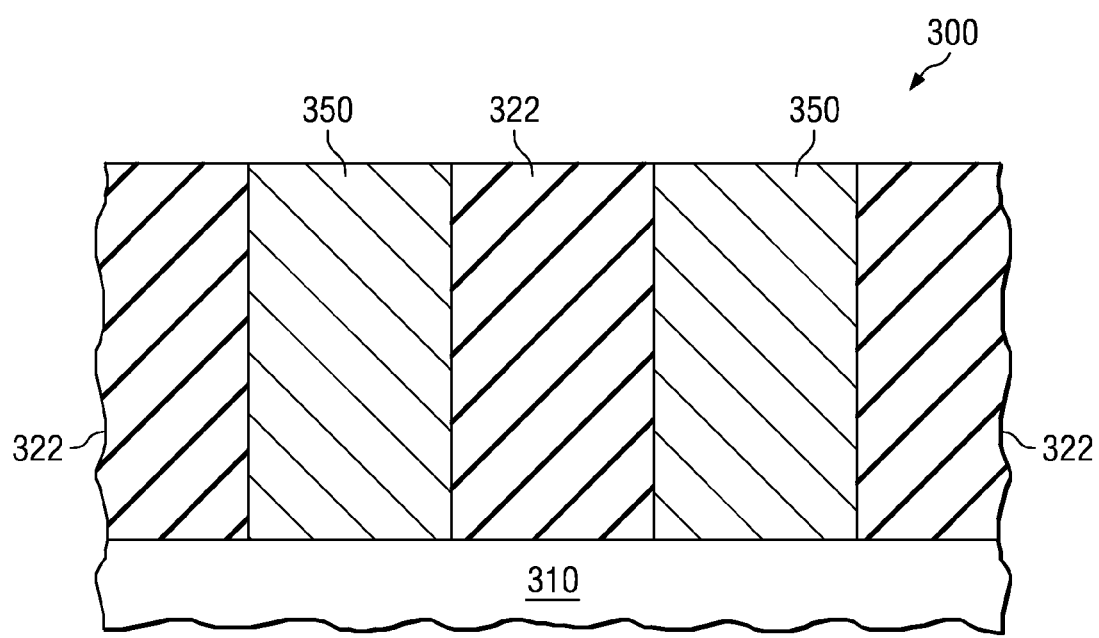
FIGS. 3A-3C depict cross-sectional views of an alternative example triple-gate semiconductor device at various stages of fabrication in accordance with the present teachings.
Figure 3B:
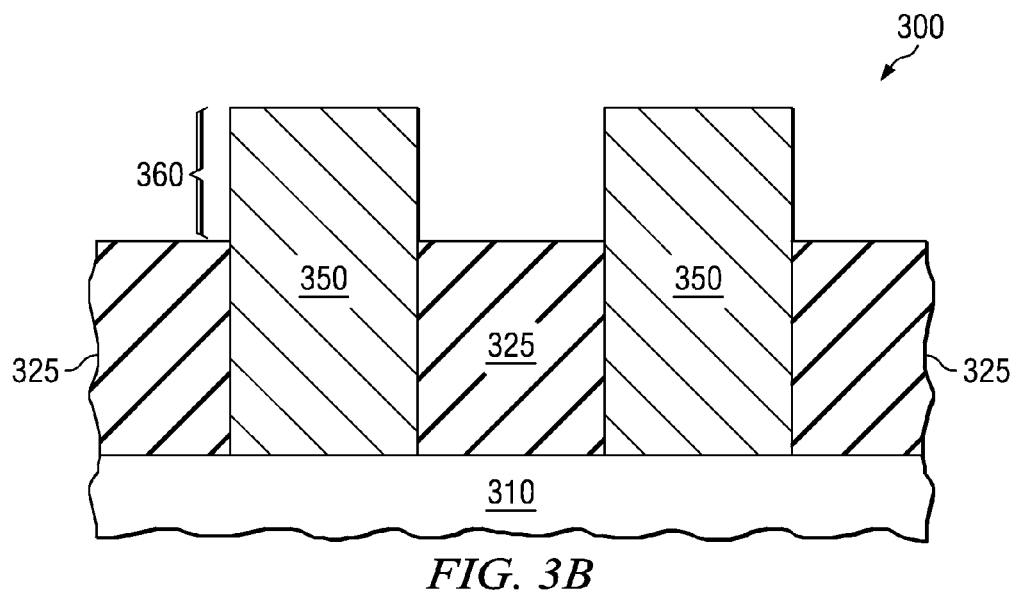
Figure 3C:
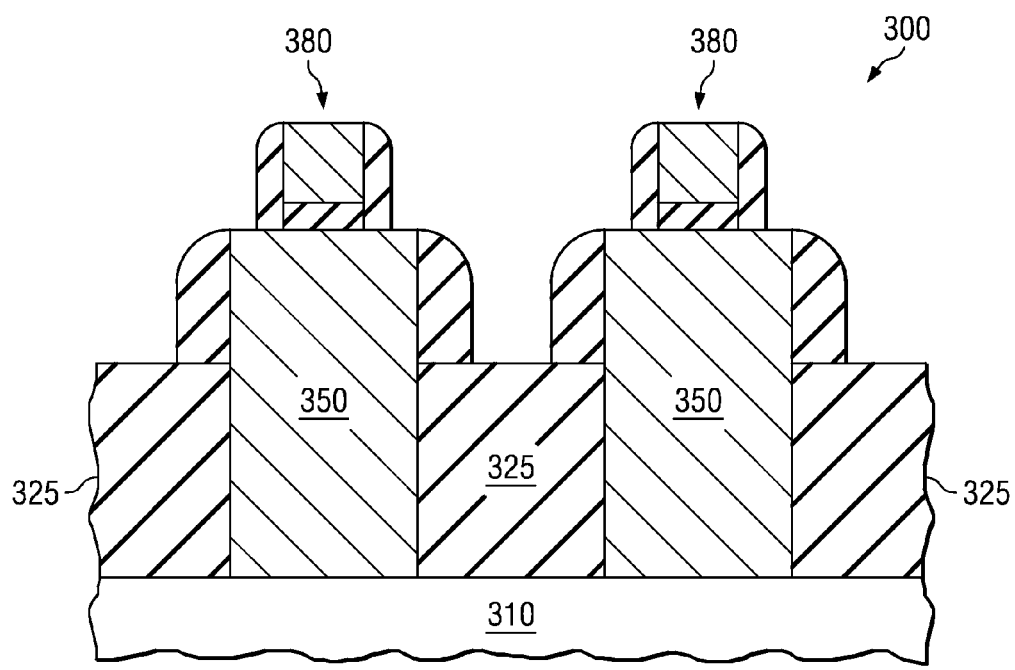

In various embodiments, a thick dielectric layer can be used to replace the stacked layers to form the triple-gate devices. FIGS. 3A-3C depict an alternative example semiconductor device 300 at various stages of fabrication in accordance with the present teachings.

In FIG. 3A, the device 300 can include a semiconductor substrate 310, a patterned thick dielectric layer 322, and active areas 350. The active areas 350 can be formed on the semiconductor substrate 310 and isolated by the patterned thick dielectric layer 322. The patterned thick dielectric layer 322 can have a thickness of about 30 nm to about 400 nm. In various embodiments, the active areas 350 can be formed by growing or depositing active area materials in one or more trenches (not shown) formed by patterning and etching the thick dielectric layer formed on the semiconductor substrate 310.

In FIG. 3B, the isolation structures 325 can be formed by etching back the patterned thick dielectric layer 322 and exposing semiconductor bodies 360 of the active areas 350, while leaving a lower surface of the isolation structures 325.

In FIG. 3C, example triple-gate devices 380 can be formed over the exposed semiconductor bodies 360 (see FIG. 3B) and isolated by the isolation structures 325 using standard process flows for triple-gate transistors.

Other embodiments of the invention will be apparent to those skilled in the art from consideration of the specification and practice of the invention disclosed herein. It is intended that the specification and examples be considered as illustrative only of the invention as more fully defined by the claims.

What is claimed is:

1. A method for making a semiconductor device, comprising:
   providing a substrate of semiconductor material; forming an isolating oxide dielectric layer over the substrate;
   forming a form layer on the isolating oxide dielectric layer;
   forming trenches through the form layer and the isolating oxide dielectric layer, exposing portions of the surface of the substrate semiconductor material, wherein the trenches do not further expose the semiconductor material at any sidewall of the trenches;
   forming a stressor layer as vertical sidewalls along the one or more trenches;

filling the trenches by epitaxial growth from the exposed portions to define active areas of the semiconductor material isolated by remaining portions of the isolating oxide layer;

removing the form layer, thereby exposing portions of the active areas in elevated positions above a surface of the isolating oxide dielectric layer forming a gate dielectric over the exposed portions of the active areas;

forming a gate electrode over the gate dielectric; and implanting dopant into source/drain portions of the active areas, wherein remaining portions of the isolating oxide dielectric layer are isolation structures between various active areas.

2. The method of claim 1, wherein the semiconductor material comprises silicon; and the isolating oxide dielectric layer is a thermally grown silicon oxide.

3. The method of claim 2, further comprising forming a hard mask layer over the isolating oxide dielectric layer; and patterning and etching the hard mask layer to define trench openings; wherein the trenches are formed by etching the isolating oxide dielectric layer through the patterned and etched hard mask layer.

4. The method of claim 3, further comprising trimming the patterned and etched hard mask layer prior to etching the isolating oxide dielectric layer.

5. The method of claim 4, further comprising pretreating the trenches including the exposed portions of the semiconductor material prior to filling the trenches.

6. The method of claim 5, wherein the pretreating comprises an anneal.

7. The method of claim 3, wherein forming the trenches comprises forming the trenches with generally vertical sidewalls.

8. The method of claim 7, further comprising exposing portions of the active areas in elevated positions above a surface of the isolating oxide dielectric layer.

9. The method of claim 1, wherein the isolating oxide layer is formed to have a thickness of about 30 nm to about 400 nm.

10. The method of claim 1, wherein the semiconductor material comprises silicon; wherein forming the isolating oxide layer comprises forming a thermally grown silicon oxide layer as a blanket layer over a surface of the substrate of semiconductor material; and wherein forming the trenches comprises:

forming a hard mask layer over the silicon oxide layer, patterning and etching the hard mask layer to define trench openings, and etching the silicon oxide layer through the patterned and etched hard mask layer to form the trenches.

11. The method of claim 10, further comprising exposing bodies of the active areas above a surface of the dielectric layer.

12. The method of claim 1, wherein the geometry of the one or more trenches for active areas can be determined by the lithographic process and the mechanical stability of the dielectric materials used.

13. A method for fabricating a semiconductor device, comprising:

providing a semiconductor substrate comprising silicon;

forming a thermally grown silicon oxide layer as a blanket layer over a surface of the semiconductor substrate;

forming a hard mask layer over the silicon oxide layer;

patterning and etching the hard mask layer to define trench openings;

etching the silicon oxide layer through the patterned and etched hard mask layer to form trenches with generally vertical sidewalls through the silicon oxide layer, exposing portions of the surface of the semiconductor substrate, wherein the trenches do not further expose the semiconductor material at any sidewall of the trenches;

forming a stressor layer as vertical sidewalls along the one or more trenches;

filling the trenches by epitaxial growth from the exposed portions to define active areas comprising silicon isolated by remaining portions of the silicon oxide layer; and removing the hard mask layer, thereby exposing portions of the active areas in elevated positions above a surface of the isolating oxide layer, and forming transistor gates on the exposed bodies of the active areas, wherein remaining portions of the silicon oxide layer are isolation structures between various active areas.

14. The method of claim 13, further comprising forming a gate dielectric over the exposed portions of the active areas; forming a gate electrode over the gate dielectric; and implanting dopant into source/drain portions of the exposed portions of the active areas.

15. The method of claim 13, wherein the geometry of the one or more trenches for active areas can be determined by the lithographic process and the mechanical stability of the dielectric materials used.

16. A method for making a semiconductor device, comprising: providing a substrate of semiconductor material;

forming an isolating dielectric layer over the semiconductor substrate;

forming trenches through the isolating dielectric layer, exposing portions of the surface of the semiconductor substrate material, wherein the trenches do not further expose the semiconductor material at any sidewall of the trenches;

forming a stressor layer as vertical sidewalls along the one or more trenches;

filling the trenches by epitaxial growth from the exposed portions to define active areas of the semiconductor material isolated by remaining portions of the dielectric layer;

exposing bodies of the active areas above a surface of the dielectric layer; and forming transistor gates on the exposed bodies of the active areas, wherein remaining portions of the isolating oxide dielectric layer are isolation structures between various active areas.

17. The method of claim 16, wherein the geometry of the one or more trenches for active areas can be determined by the lithographic process and the mechanical stability of the dielectric materials used.

* * * * *